US008890575B1

(12) United States Patent
Jang

(10) Patent No.: US 8,890,575 B1
(45) Date of Patent: Nov. 18, 2014

(54) GLITCH-FREE INPUT TRANSITION DETECTOR

(71) Applicant: Integrated Silicon Solution, Inc., Milpitas, CA (US)

(72) Inventor: Seong Jun Jang, San Jose, CA (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

(21) Appl. No.: 13/946,734

(22) Filed: Jul. 19, 2013

(51) Int. Cl.
*G01R 29/02* (2006.01)
*H03K 3/013* (2006.01)
*G01R 19/165* (2006.01)

(52) U.S. Cl.
CPC .......... *G01R 19/16504* (2013.01); *H03K 3/013* (2013.01)
USPC ............... 327/31; 327/34; 327/38; 365/233.5

(58) Field of Classification Search
USPC ....................... 327/18, 24, 26, 31, 34, 36, 38; 365/233.5
See application file for complete search history.

(56) References Cited

U.S. PATENT DOCUMENTS 5,604,455 A * 2/1997 Bion et al. ..................... 327/176
6,140,861 A * 10/2000 Koelling et al. ............... 327/536

* cited by examiner

*Primary Examiner* — Long Nguyen
(74) *Attorney, Agent, or Firm* — Van Pelt, Yi & James LLP

(57) ABSTRACT

A circuit for detecting a signal transition on an input signal includes a mirror delay circuit and an input blocking circuit to prevent signal glitches or undesired signal pulses from being passed to the output signal node, thereby preventing signal distortions from being detected as a valid signal transition. The input transition detection circuit generates stable and correct transition detection pulses having a consistent pulse width.

14 Claims, 6 Drawing Sheets

GLITCH-FREE INPUT TRANSITION DETECTOR

BACKGROUND OF THE INVENTION

Modern day electronic systems demand very clean power and signal conditions due to high signal sensitivity. However, in practice, signal distortions, such as noise, signal glitches or timing mismatches, cannot be avoided due to the combination of different electronic components in a system, each with its own functionalities and logic complexities. Signal glitches are of particular concern as the glitches may be erroneously perceived as a valid input signal to the input circuit of a system. Signal glitches can be difficult to detect as the glitches are unpredictable and can be very narrow, such as nano or pico second pulse width.

Electronic systems often employ an Input Transition Detection (ITD) circuit, such as an address transition detector (ATD) or a data transition detector (DTD), following the input stage to detect for signal transitions on the input signal. However, these input transition detection circuits are susceptible to error when the input signal is distorted by glitches. The ITD circuit may recognize signal glitches as a valid input signal transition and erroneously assert a signal detection output.

FIG. 1 is a circuit diagram of a conventional input transition detection circuit. Referring to FIG. 1, an input transition detection circuit 20 typically includes a chain of inverters 1-8 receiving an input signal IN (node 14) and generating an output signal OUT1 (node 16). An additional inverter 9 is usually provided to help latch the input signal transitions. The output signal OUT1 is provided to an input transition detector 10 which detects a transition on the output signal and generates a detection pulse. The detection pulse is amplified, such as by an inverter 12, to generate the detection output signal ATD1 (node 18). In the conventional input transition detection circuit 20, input signal transitions are passed directly to the output signal OUT1. Thus, when glitches or signal distortions appear on the input signal IN, the input transition detector 10 may recognize the glitches as a valid signal transition. As a result, the detection output signal ATD1 may include erroneous detection pulses, such as causing multiple detection pulses to be generated when there is actually not a valid input transition.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a glitch-free input transition detection circuit includes a mirror delay circuit and an input blocking circuit to prevent signal glitches or undesired signal pulses from being passed to the output signal node, thereby preventing signal distortions from being detected as a valid signal transition. The glitch-free input transition detection circuit of the present invention prevents generation of erroneous transition detection pulses and further prevents short-duration detection pulses from being generated. In this manner, the input transition detection circuit generates stable and correct transition detection pulses having a consistent pulse width. The input transition detection circuit of the present invention can be applied in electronic systems or electronic components, such as integrated circuits, to ensure stable and normal system operation. For example, the input transition detection circuit of the present invention can be applied in a memory integrated circuit or in an electronic system involving interfaces between separate and discrete components. The input transition detection circuit of the present invention ensures that signal distortions or glitches that may be present on an input signal do not interfere with normal system operation.

Figure 2:
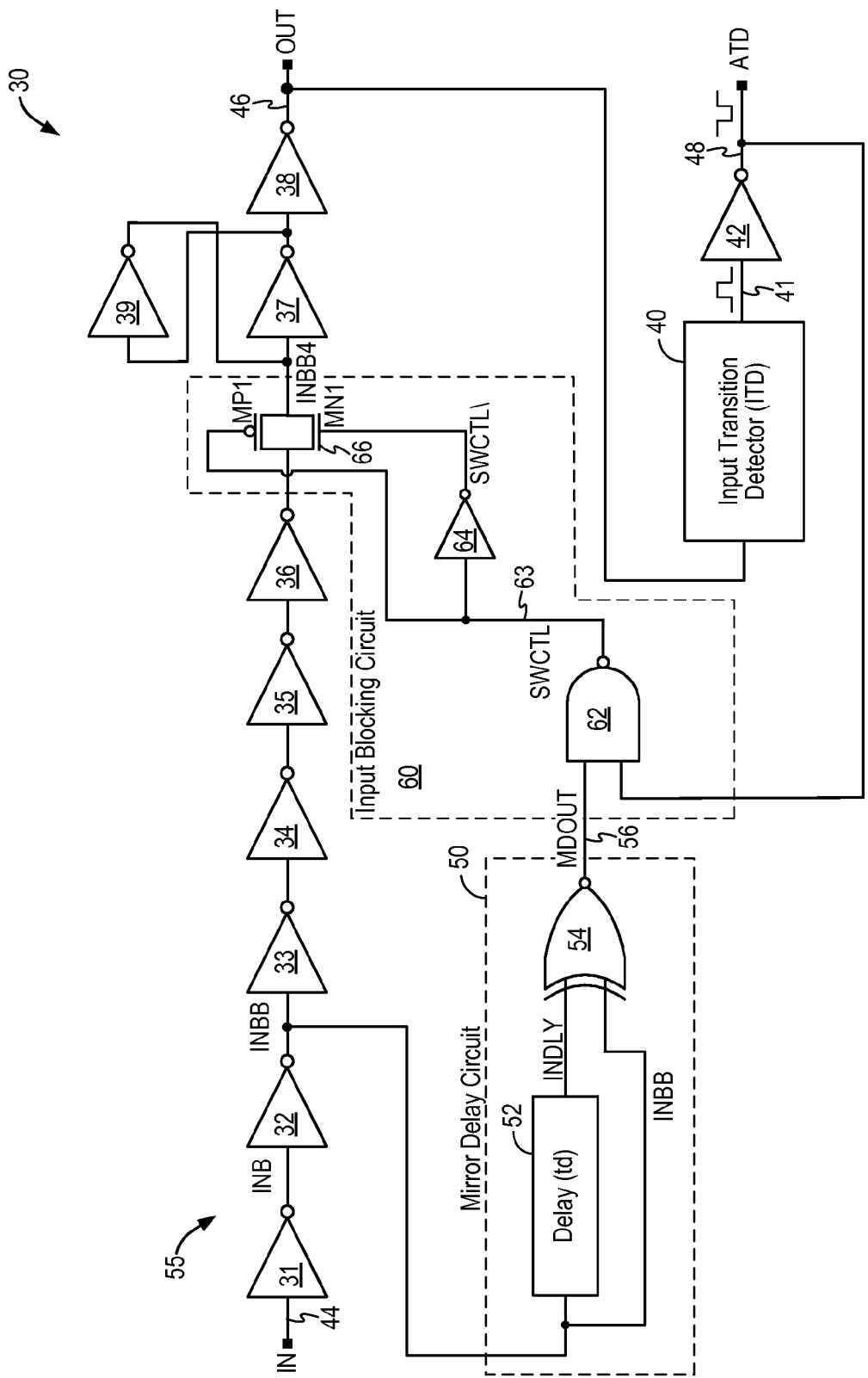
FIG. 2 is a circuit diagram of an input transition detection circuit according to one embodiment of the present invention.

FIG. 2 is a circuit diagram of an input transition detection circuit according to one embodiment of the present invention. Referring to FIG. 2, an input transition detection circuit 30 includes an input signal path 55 for coupling an input signal IN received on an input signal node 44 to an output signal node 46 as the output signal OUT. The input signal path 55 includes a chain of inverters 31-38 serially connected to amplify or buffer the input signal IN so that the output signal OUT thus generated has clean and strong signal transitions. The input signal path 55 further includes an inverter 39 cross-connected with inverter 37. That is, the input of inverter 39 is connected to the output of inverter 37 and the output of inverter 39 is connected to the input of inverter 37. Inverter 39 operates to reinforce the signal at the input of inverter 37, thereby latching the input signal being passed down on the chain of inverters to ensure stable signal transitions. In the present embodiment, the input signal path 55 is implemented using a chain of inverters. In other embodiments, the input signal path 55 may be implemented using a chain of inverting or non-inverting buffers.

The output signal OUT (node 46) is provided to an input transition detector 40 which detects a signal transition on the output signal OUT and generates a detection pulse in response to a signal transition being detected. The signal transition on the output signal OUT may be a low-going-high (lo-hi) signal transition or a high-going-low (hi-lo) signal transition. The input transition detector 40 detects the lo-hi or hi-lo signal transition and generates the detection pulse (node 41) for each transition detected on the signal OUT. In the present embodiment, the detection pulse is buffered by an inverter or an inverting buffer 42 to generate a transition detection output signal ATD (node 48). The transition detection output signal ATD is thus a series of detection pulses where each signal pulse denotes a signal transition detected at the output signal OUT. In the present embodiment, the detection pulse (node 41) is an active high signal and the transition detection output signal ATD is thus an active low signal. In other embodiments, the inverter 42 may be omitted or a non-inverting buffer may be used in its place and the transition detection output signal ATD may be an active high signal.

The input signal IN received on input signal node 44 may be corrupted due to noise, timing mismatch, or signal reflection, resulting in glitches or unwanted signal pulses. Glitches or unwanted signal pulses are signal distortions representing invalid signal transitions. However, in the conventional input circuits, when these glitches or unwanted signal pluses are passed down the input signal path, the glitches or unwanted signal pulses actually become amplified by the buffers in the input signal path so that these signal distortions appear as normal signal transitions on the output signal OUT. The input transition detector may end up detecting these invalid signal transitions as valid signal transitions and generating erroneous detection pulses.

According to embodiments of the present invention, the input transition detection circuit 30 includes a mirror delay circuit 50 and an input blocking circuit 60 to prevent signal glitches or undesired signal pulses from being detected as a valid signal transition. The mirror delay circuit 50 is configured to receive an input signal INBB being a buffered signal of the input signal IN. The input signal INBB is coupled to a delay circuit 52 to generate a signal INDLY which is a delayed version of the input signal INBB. In particular, the signal INDLY is the input signal INBB delayed by a delay time of td. In some embodiments, the delay time td is selected to be shorter than the minimum pulse width of a valid input signal or longer than the pulse width of signal distortions or glitches that need to be removed. The mirror delay circuit 50 further includes an exclusive-NOR (XNOR) logic gate 54 configured to receive the input signal INBB and the mirror delayed signal INDLY from the delay circuit. The XNOR logic gate 54 generates a mirror delay output signal MDOUT on an output terminal 56. The mirror delay output signal MDOUT is deasserted (logical low) when the input signals to the XNOR logic gate have different logical states. That is, when the signal INBB and the mirror delayed signal INDLY have different logical states, signal MDOUT is deasserted (logical low). On the other hand, the mirror delay output signal MDOUT is asserted (logical high) when the input signals to the XNOR logic gate have the same logical states. That is, when the signal INBB and the mirror delayed signal INDLY have the same logical states, signal MDOUT is asserted (logical high).

As thus configured, the mirror delay circuit 50 generates the mirror delay output signal MDOUT that is not activated (or deasserted) when the INBB signal and its delayed version have different logical states. The mirror delay output signal MDOUT is activated (or asserted) when the INBB signal and its delayed version have the same logical states. In operation, when the input signal transition is valid, the signal INBB and the delayed signal INDLY will be different initially during the delay time period. However, after the delay time, the signal INBB and delayed signal INDLY will have the same logical state. Thus, for a valid input signal transition, the MDOUT signal will be inactivated (deasserted or logical low) for a delay time td and become activated (asserted or logical high) after the delay time. On the other hand, when the input signal transition is invalid, such as when the input signal transition is a glitch, the signal INBB and the delayed signal INDLY will be different during the delay time period and will continue to be different after the delay time period. Thus, for an invalid input signal transition, the MDOUT signal will be inactivated (deasserted or logical low) until a delay time after the next valid input signal transition.

More specifically, the delay time td of the delay circuit 52 is selected so that when the input signal transitions are merely glitches or short signal pulses, the signal INBB and the delayed signal INDLY will not overlap. When these two signals do not overlap, the MDOUT signal will not be activated. When the input signal transitions are valid signal transitions, the signal INBB and the delayed signal INDLY will overlap after the delay time so that the output signal MDOUT will be activated.

The MDOUT signal is one of the input to the input blocking circuit 60. When the MDOUT signal is inactivated, the input blocking circuit 60 is enabled to block the input signal path 55 so that invalid input signal transition cannot propagate from the input signal node 44 to the output signal node 46. The activation of the MDOUT signal in conjunction with other parameters can disable the input blocking circuit 60 to allow the input signal path 55 to pass the input signal IN to the output signal OUT, as will be explained in more detail below. The mirror delay circuit 50 controls the blocking time of the input blocking circuit 60 to screen out signal glitches and input distortions so that invalid signal transitions are prevented from being passed to the output signal node 46.

The input blocking circuit 60 includes a switch 66 coupled in and intercepting the input signal path 55. Switch 66 is open to block input signal transitions received on input signal node 44 from propagating to the output signal node 46. Switch 66 is closed to allow input signal transitions to propagate from the input signal node 44 to the output signal node 46. In the present embodiment, the switch 66 is coupled between inverter 36 and inverter 37 in the input signal path 55. In particular, the switch 66 is coupled before the cross-coupled inverter pair of inverters 37 and 39. When switch 66 is open, the cross-coupled inverter pair operates to latch the logical state of the input signal INBB4 of the inverter 37. In this manner, the output signal OUT (node 46) maintains the previous valid signal transition state when switch 66 is open.

Switch 66 is controlled by a switch control signal SWCTL (node 63). When the switch control signal SWCTL is asserted, switch 66 is closed to complete the input signal path 55. When the switch control signal SWCTL is deasserted, switch 66 is open to block the input signal path 55. In the present embodiment, the switch 66 is implemented as a CMOS transmission gate. The CMOS transmission gate is formed as a parallel combination of an NMOS transistor MN1 and a PMOS transistor MP1 driven by complementary gate signals. In the present embodiment, the switch control signal SWCTL is coupled to drive the PMOS transistor MP1 and an inverted switch control signal SWCTL\, inverted by an inverter 64, is coupled to drive the NMOS transistor MN1. Thus, in the present embodiment, the switch control signal SWCTL is asserted (logical low) to close the switch 66 and is deasserted (logical high) to open the switch 66.

The input blocking circuit 60 includes an NAND gate 62 to generate the switch control signal SWCTL. The NAND gate 62 receives the mirror delay output signal MDOUT (node 56)

and the transition detection output signal ATD (node 48) as input signals. The NAND gate 62 generates the switch control signal SWCTL (node 63) when the MDOUT signal is activated (asserted or logical high) and the ATD signal is deasserted (logical high). More specifically, the NAND gate output signal (signal SWCTL) is deasserted (logical high) when either the MDOUT signal is deasserted (logical low) or the ATD signal is asserted (logical low). The NAND gate output signal (signal SWCTL) is asserted (logical low) only when both the MDOUT signal is asserted (logical high) and the ATD signal is deasserted (logical high).

In operation, the input blocking circuit 60 blocks the input signal path 55 when the mirror delay output signal is not activated (logical low). That is, during the initial delay time of a signal transition and also when the mirror delay circuit 50 detects that the input signal transitions are invalid, the MDOUT signal is not activated and the input blocking circuit 60 deasserts the switch control signal SWCTL to block the input signal path 55. However, even when the MDOUT signal is activated (logical high) in response to the detection of a valid input signal transition, the input blocking circuit 60 does not assert the switch control signal SWCTL until the transition detection output signal ATD completes the previous detection pulse and is deasserted (logical high). In this manner, the input detection circuit 30 ensures that the detection pulses will always have the same pulse width.

As thus configured, the input transition detection circuit 30 operates to block signal glitches or unwanted signal pulses from passing from the input signal IN to the output signal OUT. Thus, the input transition detector 40 will be prevented from generating unwanted transition detection pulses. Furthermore, the input transition detection circuit 30 blocks valid signal transitions from passing to the output signal OUT until the previous transition detection pulse is completed. Thus, the transition detection pulse has a guarantee pulse width.

In embodiments of the present invention, the delay circuit 52 may be implemented using a serial connection of inverters or buffers, as a RC delay circuit, or a combination of buffers and RC delay circuit. In one embodiment, the delay time td is a function of the pulse width of signal glitches to be blocked. In some embodiments, the delay time td is in the range of a few pico seconds to multiple seconds to multiple minutes.

Furthermore, in embodiments of the present invention, the transition detection output signal ATD may be an active high signal. In that case, the input blocking circuit 60 may be configured with other appropriate logic gates to generate the switch control signal SWCTL. For instance, in one embodiment, when the transition detection output signal ATD is an active high signal, an inverter may be used to invert the active-high ATD signal to provide an inverted ATD signal to the NAND gate 62.

Figure 3:
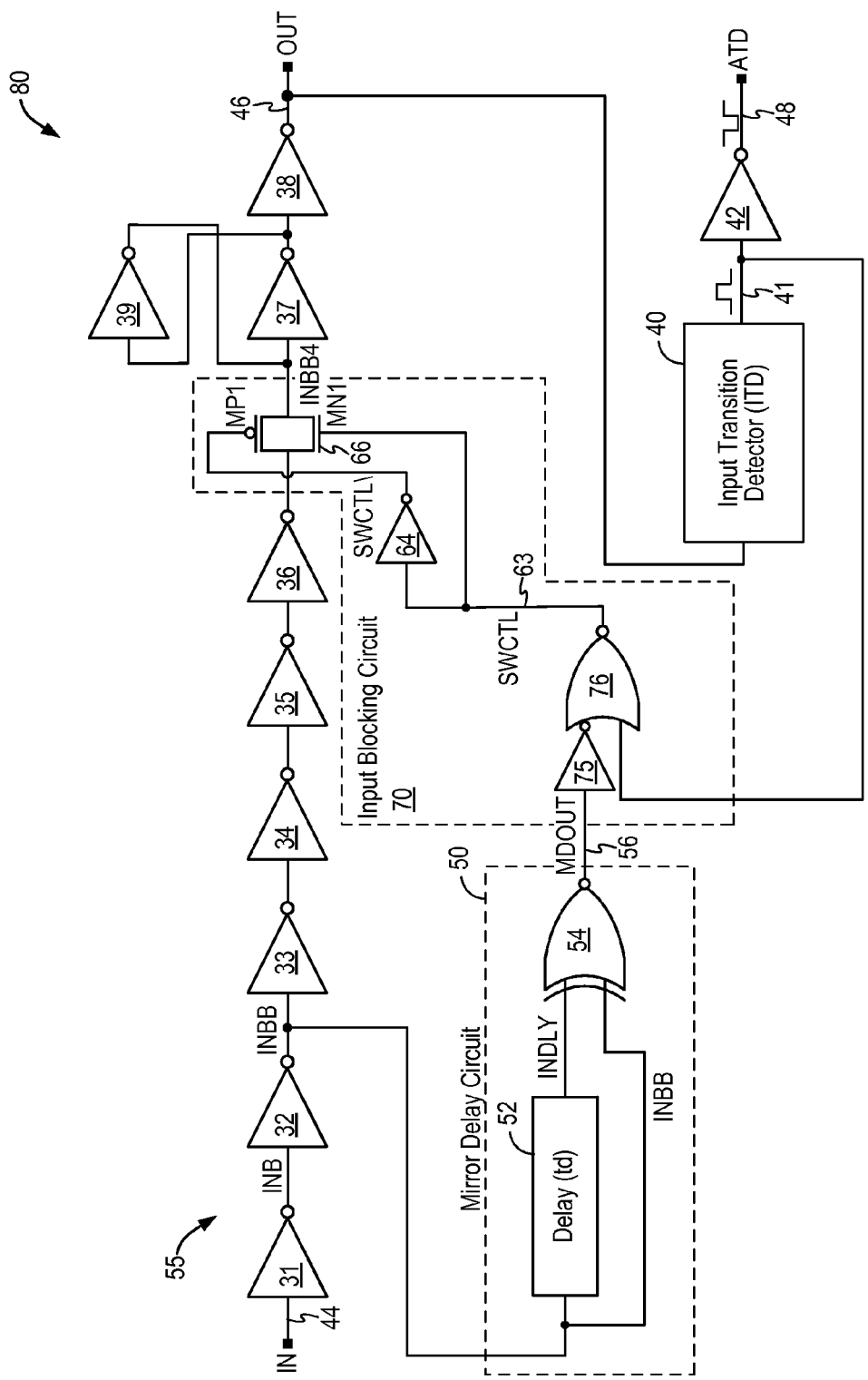
FIG. 3 is a circuit diagram of an input transition detection circuit according to an alternate embodiment of the present invention.

FIG. 2 illustrates one configuration of the input blocking circuit for generating the switch control signal SWCTL to block or unblock the input signal path. In other embodiments, the input blocking circuit may be constructed using other logical circuit configurations to generate the switch control signal SWCTL having the same logical functions. FIG. 3 is a circuit diagram of an input transition detection circuit according to an alternate embodiment of the present invention. FIG. 3 illustrates another circuit configuration for the input blocking circuit. Like elements in FIG. 2 and FIG. 3 are given like reference numerals and will not be further described. Referring to FIG. 3, the input detection circuit 80 includes an input blocking circuit 70 configured to generate the switch control signal SWCTL (node 63). The input block circuit 70 includes an inverter 75 configured to receive the mirror delay output signal MDOUT (node 56) and an NOR gate 76 configured to receive the inverted MDOUT signal and an active-high transition detection output signal. In the present embodiment, the active-high transition detection output signal is taken from the output node 41 of the input transition detector 40. In other embodiments, the inverter 42 may be replaced with a non-inverting buffer to generate a transition detection output signal ATD on node 48 that is an active high signal. When inverter 42 is replaced with a non-inverting buffer, the output signal on node 48 is active high and may be coupled to the input of the NOR gate 76.

In the present embodiment, the NOR gate 76 generates a switch control SWCTL signal that is an active high signal. Thus, the switch control signal SWCTL (node 63) is coupled to drive the NMOS transistor MN1 of the CMOS transmission gate 66 directly. The switch control signal SWCTL is inverted by an inverter 64 and the inverted signal SWCTL\ is coupled to drive the PMOS transistor MP1 of the CMOS transmission gate 66. The circuit configurations for the input blocking circuit in FIG. 2 and FIG. 3 are illustrative only and not intended to be limiting. Other configurations are possible for the input blocking circuit to generate the switch control signal.

Figure 4:
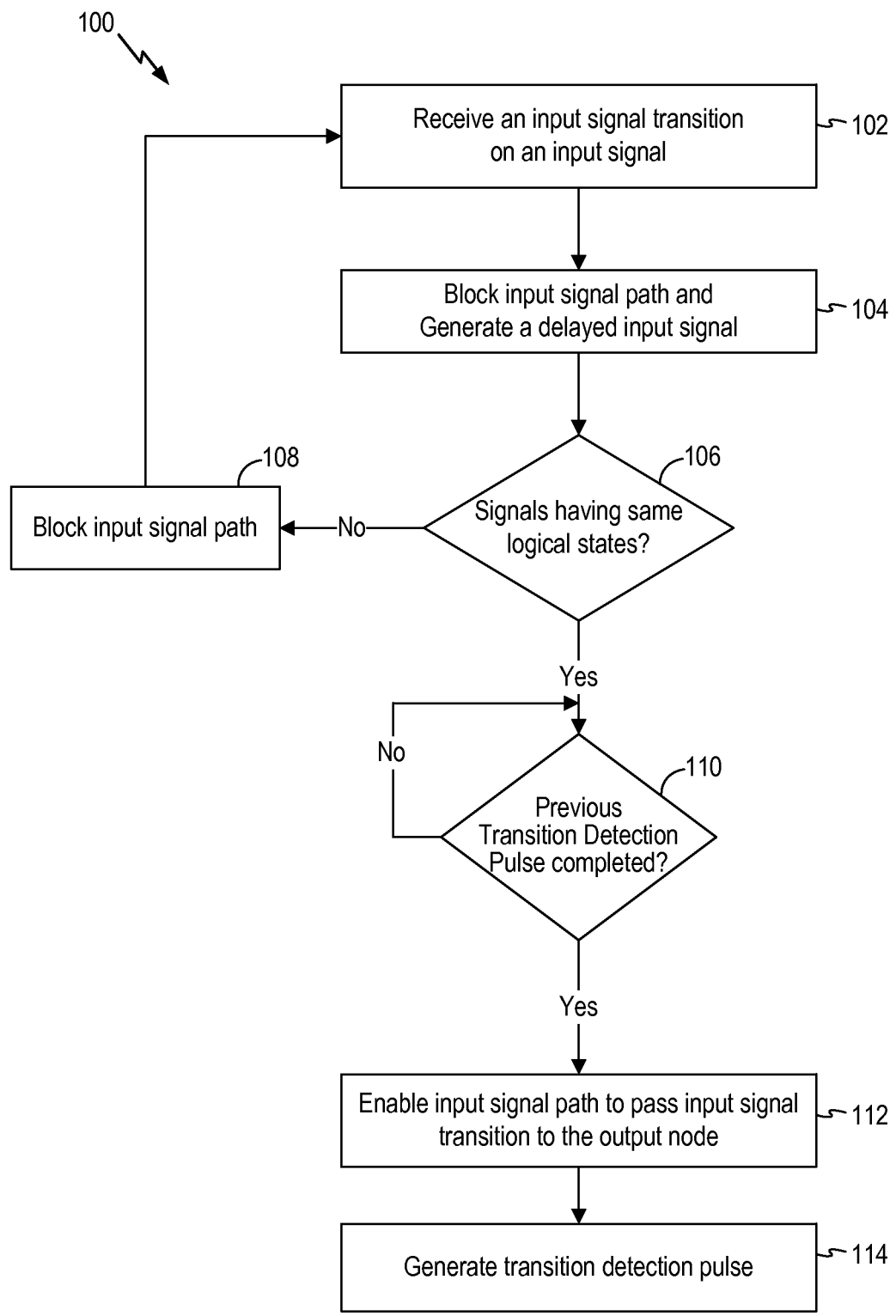
FIG. 4 is a flow chart illustrating an input transition detection method according to one embodiment of the present invention.

FIG. 4 is a flow chart illustrating an input transition detection method according to one embodiment of the present invention. Referring to FIG. 4, an input transition detection method 100 starts when an input signal transition on an input signal is received (102). In response to an input signal transition being received, the method blocks the input signal path and generates a delayed input signal based on the received input signal transition (104). The method 100 determines whether the input signal and the delayed input signal have the same logical state (106). In some embodiments, the input signal is a buffered signal of the input signal and the delayed input signal is generated from the buffered input signal.

If the input signal and the delayed input signal do not have the same logical state, the method 100 continues to block the input signal path (108) and the method returns to 102 to receive the next input signal transition.

If the input signal and the delayed input signal have the same logical state, the method 100 continues to determine if the previous transition detection pulse has been completed (110). If the previous transition detection pulse has not been completed, method 100 waits for the completion of the previous transition detection pulse. If the previous transition detection pulse has been completed, method 100 proceeds to enable the input signal path to pass the input signal transition to the output node (112). Method 100 then generates a transition detection pulse based on the input signal transition that is passed to the output node (114). Method 100 may then repeats at 102 to receive the next input signal transition.

Figure 1:
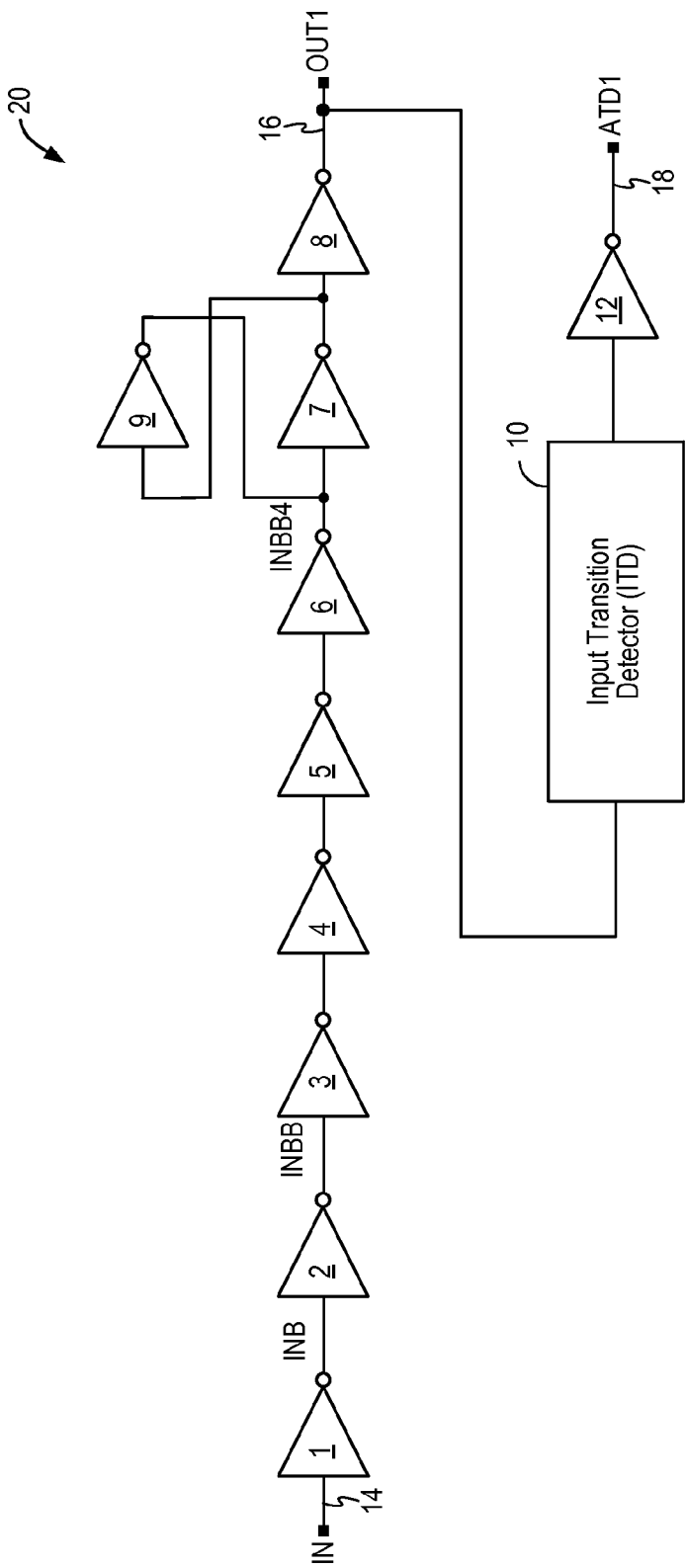
FIG. 1 is a circuit diagram of a conventional input transition detector.
Figure 5:
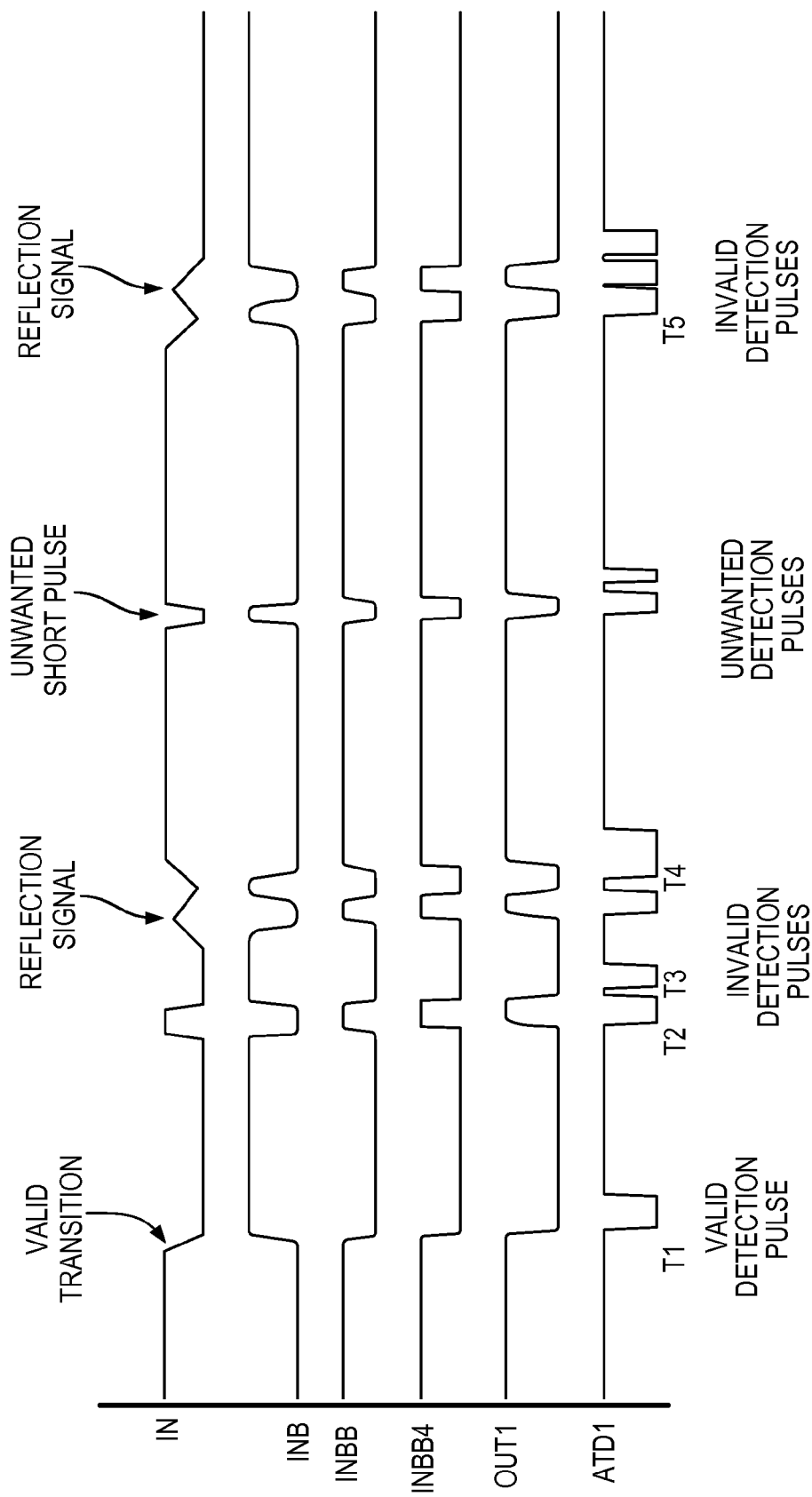
FIG. 5 illustrates signal waveforms for the conventional input transition detection circuit of FIG. 1.

FIG. 5 illustrates signal waveforms for the conventional input transition detection circuit of FIG. 1. Referring to FIG. 5, the input signal IN is shown with valid signal transitions and also invalid signal transitions, including reflection signals and short pulse signals. In the conventional input transition detection circuit, these invalid signal transitions are amplified and buffered as the signal transitions propagate down the signal path. These invalid signal transitions appear on the output signal OUT1 as "normal" signal transitions. The input transition detector ends up generating a transition detection output signal ATD1 including signal pulses for all the signal transitions, whether valid transitions or invalid transitions. In the waveforms shown in FIG. 5, only the signal transitions at times T1, T2, T3, T4 and T5 are valid transitions. However, the transition detection output signal ATD1 contains additional detection pulses for the invalid signal transitions as well. These additional, erroneous detection pulses affects normal system operations.

Figure 6:
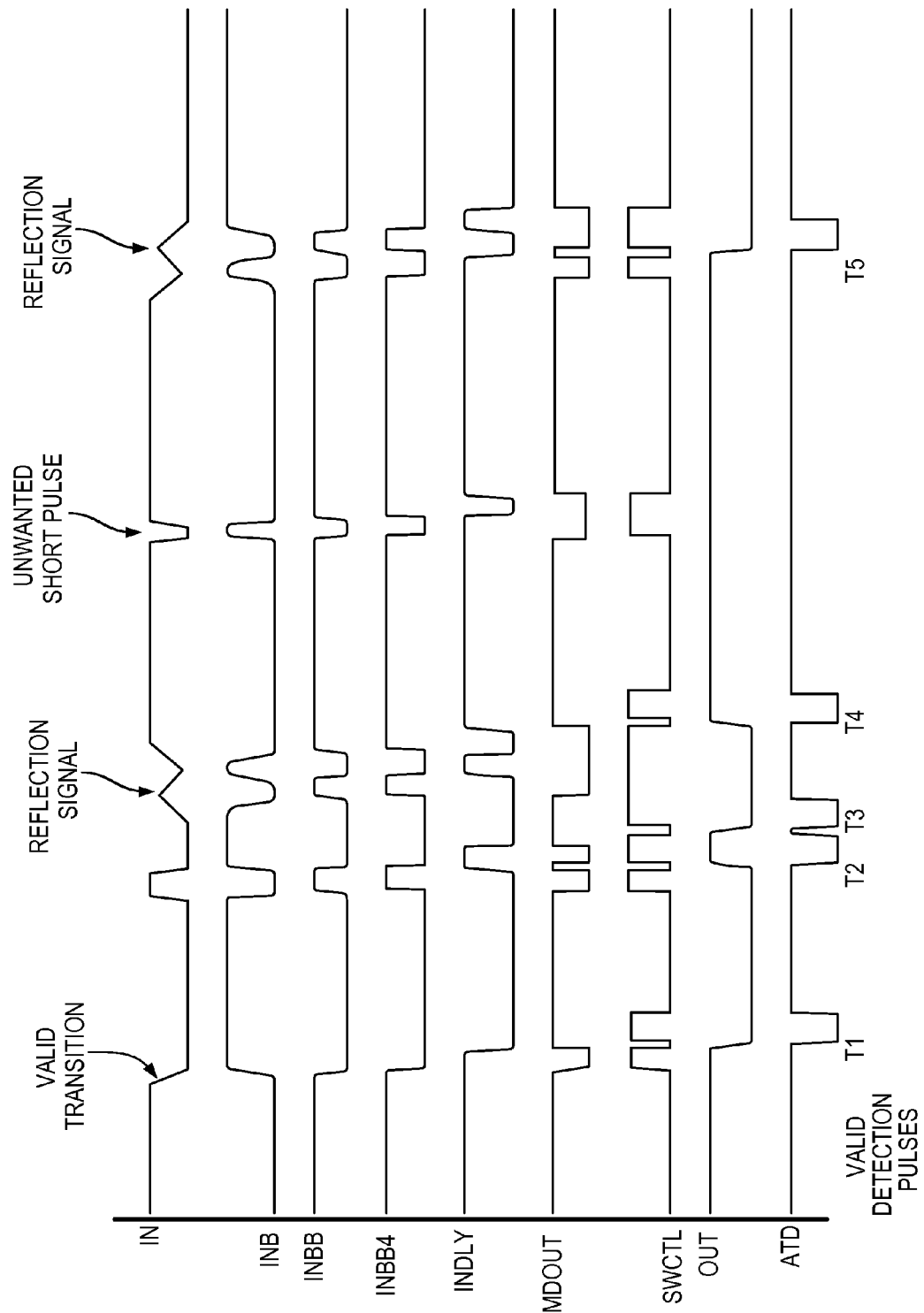
FIG. 6 illustrates signal waveforms for the input transition detection circuit of FIG. 2 in embodiments of the present invention.

FIG. 6 illustrates signal waveforms for the input transition detection circuit of FIG. 2 in embodiments of the present invention. Referring to FIG. 6, the input signal IN is shown with valid signal transitions and invalid signal transitions same as the input signal IN in FIG. 5. The mirror delay circuit in the input transition circuit of the present invention generates the delayed input signal INDLY and compares the buffered input signal INBB with the delayed input signal INDLY. The mirror delay output signal MDOUT is asserted (logical high) when the signals INBB and the INDLY have the same logical state. The switch control signal SWCTL is asserted (logical low) when the MDOUT signal is asserted (logical high) and the transition detection output signal ATD is deasserted (logical high). In the waveforms shown in FIG. 6, only the signal transitions at times T1, T2, T3, T4 and T5 are valid transitions and the input transition detection circuit generates five detection pulses in response to the five valid signal transitions. Furthermore, the detection pulses in the signal ATD all have the same pulse width or have the same minimum pulse width so that the detection pulses can be reliably detected by subsequent systems receiving the transition detection output signal ATD.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A circuit for detecting a signal transition on an input signal, the circuit comprising:
    an input signal path configured to receive an input signal on an input node and to provide a buffered input signal to an output node as an output signal;
    an input transition detector configured to receive the output signal and to generate a transition detection output signal having one or more detection pulses, each detection pulse being generated in response to a signal transition detected on the output signal;
    a mirror delay circuit configured to receive a first signal related to the input signal and to generate a second signal being the first signal delayed by a delay time, the mirror delay circuit further configured to generate a third signal based on the first signal and the second signal, the third signal being asserted in response to the first signal and the second signal having the same logical state and being deasserted in response to the first signal and the second signal having different logical states;
    an input blocking circuit configured to receive the third signal and the transition detection is output signal and to generate a switch control signal based on the third signal and the transition detection output signal, the switch control signal being asserted in response to the third signal being asserted and the transition detection output signal being deasserted, and the switch control signal being deasserted in response to the third signal being deasserted or the transition detection output signal being asserted; and
    the input block circuit comprising a switch coupled to the input signal path and controlled by the switch control signal, the switch being open in response to the switch control signal being deasserted to block a signal transition on the input signal to be passed to the output node, and the switch being closed in response to the switch control signal being asserted to pass a signal transition on the input signal to the output node.

2. The circuit of claim 1, wherein the input signal path comprises a chain of buffers serially connected between the input node and the output node, the switch being coupled to between two adjacent buffers.

3. The circuit of claim 2, wherein the input signal path comprises a first buffer and a second buffer adjacent to each other in the chain of buffers, the switch being connected between the output node of the first buffer and the input node of the second buffer, the input signal path further comprises a third buffer having an input node coupled to the output node of the second buffer and an output node coupled to the input node of the second buffer.

4. The circuit of claim 2, wherein the chain of buffers comprises inverting buffers.

5. The circuit of claim 1, wherein the delay time has a time value shorter than a minimum pulse width of a valid input signal.

6. The circuit of claim 1, wherein the delay time has a time value longer than a pulse width of an invalid signal transition.

7. The circuit of claim 1, wherein the mirror delay circuit comprises:
    a delay circuit configured to receive the first signal and to generate the second signal being delayed from the first signal by the delay time; and
    an exclusive NOR logic gate having a first input terminal configured to receive the first signal and a second input terminal configured to receive the second signal, the exclusive NOR logic gate generating the third signal based on the first signal and the second signal.

8. The circuit of claim 1, wherein the input blocking circuit comprises:
    a NAND logic gate having a first input terminal configured to receive the third signal and a second input terminal configured to receive a signal indicative of the transition detection output signal, the switch control signal being an active low signal.

9. The circuit of claim 8, wherein the switch comprises a CMOS transmission gate including an NMOS transistor and a PMOS transistor connected in parallel, the PMOS transistor being controlled by the switch control signal and the NMOS transistor being controlled by an inverted signal of the switch control signal.

10. The circuit of claim 1, wherein the input blocking circuit comprises:
    a first inverter having an input terminal configured to receive the third signal and to generate an inverted third signal; and
    a NOR logic gate having a first input terminal configured to receive the inverted third signal and a second input terminal configured to receive a signal indicative of the transition detection output signal, the switch control signal being an active high signal.

11. A method for detecting a signal transition on an input signal, the method comprising:
    coupling the input signal though an input signal path to an output signal node as an output is signal;
    generating a transition detection output signal having one or more detection pulses, each detection pulse being generated in response to a signal transition detected on the output signal;
    receiving an input signal transition on the input signal;
    blocking input signal path;
    generating a second signal from a first signal related to the input signal, the second signal being the first signal delayed by a delay time;

continuing to block the input signal path in response to first signal and the second signal having different logical states;

determining a previous detection pulse of the transition detection output signal has completed; and enabling the input signal path in response to first signal and the second signal having the same logical state and to the determining the previous detection pulse of the transition detection output signal has completed.

12. The method of claim 11, further comprising:

generating a detection pulse in response to the signal transition at the output signal after the input signal path is enabled.

13. The method of claim 11, wherein the delay time has a time value shorter than a minimum pulse width of a valid input signal.

14. The method of claim 11, wherein the delay time has a time value longer than a pulse width of an invalid signal transition.

* * * * *